(12) United States Patent
Moenkemoeller

(10) Patent No.: US 10,549,716 B2
(45) Date of Patent: Feb. 4, 2020

(54) ELECTROSTATIC SENSOR SYSTEM

(71) Applicant: paragon ag, Delbrueck (DE)

(72) Inventor: Ralf Moenkemoeller, Bielefeld (DE)

(73) Assignee: paragon AG, Delbrueck (DE)

( * ) Notice: Subject to any disclaimer, the term of this patent is extended or adjusted under 35 U.S.C. 154(b) by 172 days.

(21) Appl. No.: 15/839,945

(22) Filed: Dec. 13, 2017

(65) Prior Publication Data

US 2018/0162319 A1    Jun. 14, 2018

(30) Foreign Application Priority Data

Dec. 14, 2016   (DE) .......................... 10 2016 014 858

(51) Int. Cl.
| | | |
|---|---|---|
| *B60R 22/48* | (2006.01) | |
| *B60R 21/015* | (2006.01) | |
| *G01V 3/08* | (2006.01) | |
| *G01R 29/12* | (2006.01) | |

(52) U.S. Cl.
CPC .............. *B60R 22/48* (2013.01); *G01V 3/088* (2013.01); *B60R 2022/4816* (2013.01); *G01R 29/12* (2013.01)

(58) Field of Classification Search
CPC ............ B60R 22/48; B60R 2022/4808; B60R 2022/4816; B60R 21/01532; B60R 21/01544; B60N 2/002; G01V 3/088; G01R 29/12
See application file for complete search history.

(56) References Cited

U.S. PATENT DOCUMENTS

| | | | | |
|---|---|---|---|---|
| 5,914,610 A | * | 6/1999 | Gershenfeld | .......... B60N 2/002 324/658 |
| 5,948,031 A | * | 9/1999 | Jinno | ................ B60R 21/01532 701/45 |
| 6,439,333 B2 | | 8/2002 | Domens | |
| 7,576,642 B2 | | 8/2009 | Rodemer | |
| 2001/0019272 A1 | * | 9/2001 | Eisenmann | ............ B60N 2/002 324/674 |
| 2001/0020205 A1 | * | 9/2001 | Eisenmann | ............ B60N 2/002 701/45 |
| 2003/0047998 A1 | * | 3/2003 | Lester | .................... B60N 2/002 307/10.1 |

(Continued)

FOREIGN PATENT DOCUMENTS

| | | |
|---|---|---|
| DE | 102008044903 B | 3/2010 |
| EP | 2937251 A | 7/2017 |

*Primary Examiner* — Frank B Vanaman
(74) *Attorney, Agent, or Firm* — Andrew Wilford

(57) ABSTRACT

An electrostatic sensor system is carried on two relatively movable objects between which a person can be disposed for determining the presence or absence of the person between the objects. One electrode on is one of the objects and first and second electrodes are on the other of the objects. A controller or control means applies an electrical charge to the one electrode on one object or the first and second electrodes on the other object, determines a coupling factor between the one electrode on the one object and the first electrode arranged on the other object and a coupling factor between the electrode arranged on one object and the second electrode arranged on the other object can be detected, and compares the two coupling factors with one another.

15 Claims, 2 Drawing Sheets

(56) References Cited

U.S. PATENT DOCUMENTS

| | | | |
|---|---|---|---|
| 2003/0122669 A1* | 7/2003 | Filippov | B60N 2/002 340/563 |
| 2006/0164254 A1* | 7/2006 | Kamizono | B60N 2/002 340/667 |
| 2006/0187038 A1* | 8/2006 | Shieh | G01B 7/14 340/562 |
| 2010/0117845 A1* | 5/2010 | Satz | B60N 2/002 340/657 |
| 2014/0049272 A1* | 2/2014 | Kincaid | B60N 2/002 324/674 |
| 2016/0200220 A1* | 7/2016 | Sugiyama | A61B 5/6893 297/217.2 |

* cited by examiner

ELECTROSTATIC SENSOR SYSTEM

FIELD OF THE INVENTION

The present invention relates to an electrostatic sensor system. More particularly this invention concerns such a system usable with a motor-vehicle seatbelt.

BACKGROUND OF THE INVENTION

Such an electrostatic sensor system is typically provided on two objects that can assume different spatial configurations relative to one another and between which a body of a living thing can be place and by means of which one can detect whether this body is between the two objects.

A measuring arrangement for detecting the position of a motor-vehicle occupant is known from U.S. Pat. No. 6,439,333 that can detect the position of a motor-vehicle occupant in very maximally reliable and failsafe manner in order to enable the differentiated triggering of an airbag according to need. A distance measurement is performed with this known sensor and measuring system, with a seat belt of a seat-belt assembly that is in physical contact with the motor-vehicle occupant serving as an active reference position. The spacing between the seat belt of the seat-belt assembly and fixed and known points predefined within the interior of the vehicle enables the correct detection of the spatial position of the seat belt and, through that, of the motor-vehicle occupant. The spacing is measured by magnetic-field transceivers whose transmitters are advantageously in the strap of the seat-belt assembly.

One drawback of this known measuring and sensor system is that the body of a living thing whose spatial position is to be determined through detection of the seat belt hardly absorbs magnetic fields. As a result, while spacing measurements can be performed by means of the known measuring system, no distinction can be drawn using this measuring system regarding whether contact exists between the seat belt and the body of the living thing or between the seat belt and another object. Moreover, the application of magnetic fields to the thoracic region is associated with certain disadvantages and risks. The influencing or disruption of pacemakers that may be present cannot be ruled out; moreover, the magnetic strips of EC cards or cards of other types that are commonly carried in the breast pockets of articles of clothing worn by motor-vehicle occupants, for example, might be erased by the magnetic fields. What is more, a readily detectable magnetic field requires either a large number of windings or a high current. The introduction of windings or conductor loops into a fabric is associated with a relatively high level of technical effort.

A sensor system for detecting a change in the position of a motor-vehicle occupants is known from DE 10 2008 044 903 in which at least one electrode in a motor-vehicle seat for transmitting a signal and at least one other electrode for receiving the signal are provided. The position of the motor-vehicle occupant is determined through differential measurement of individual electrode signals relative to reference electrodes. In this known sensor system, the problem of fluctuating and substantially undefined coupling factors between a transmitting electrode and the body of a living thing and the undefined coupling factor between a receiving electrode and the body of a living thing is resolved. A sensor system is therefore provided with a plurality of receiving antennas, with the evaluation being performed by comparison of the induced signal voltages in the receiving antennas. One drawback of the measuring and sensor system known from DE 10 2008 044 903 is that the differences between the induced signals in the receiving antennas are evaluated. But these, in turn, are dependent on coupling factors.

A sensor and measuring system is known from EP 2 937 251 that is intended to make it possible to detect whether the seat belt of a seat-belt assembly is properly in place on a motor-vehicle seat. A sensor is provided spaced from the seat and from the seat belt of the seat-belt assembly. This spatial arrangement results in a substantial drawback with respect to motor-vehicles, since an installation that uses various locations of the motor-vehicle is required for this measuring system. Besides the domain that encompasses the motor-vehicle seat and the seat-belt assembly associated therewith, the location for the instrument panel and/or the headliner must be incorporated into the intended installation of the measuring and sensor system, for example. Moreover, the subsequent installation of the measuring and sensor system with relatively low technical and constructive effort is not possible.

A measuring and sensor system is known from U.S. Pat. No. 7,576,642 that is mounted on a seat belt of a seat-belt assembly. In this measuring system, electrical conductors for contacting the sensors of the measuring and sensor system are woven into the seat belt of the seat-belt assembly.

OBJECTS OF THE INVENTION

It is therefore an object of the present invention to provide an improved electrostatic sensor system.

Another object is the provision of such an improved electrostatic sensor system that overcomes the above-given disadvantages, in particular that by modifying an electrostatic sensor system of the type described above such that, with as little technical and constructive effort as possible, it is possible to reliably identify whether the body of a living thing is located between two objects.

SUMMARY OF THE INVENTION

An electrostatic sensor system is carried on two relatively movable objects that can assume different spatial configurations relative to one another and between which a body of a living thing can be disposed for determining whether this body is disposed between one and the other object. The system has according to the invention one electrode on one of the objects and first and second electrodes on the other of the objects offset relative to one another such that when a body is present between the objects the two electrodes have equal- or nearly equal-area body coverage whereas, if no body is between the two objects, the one electrode on the one object is at a different spacing from the first electrode on the other object than from the second electrode on the other object. A controller or control means applies an electrical charge to the one electrode on one object or the first and second electrodes on the other object, determines a coupling factor between the one electrode on the one object and the first electrode arranged on the other object and a coupling factor between the electrode arranged on one object and the second electrode arranged on the other object can be detected, and compares the two coupling factors with one another.

According to the invention, the electric field-based electrostatic sensor system can reliably identify whether or not the body of a living thing is located between two objects. The expression "electric field-based" is intended to refer to all technical arrangements that exploit the characteristics of electric fields, such as the propagation of electric fields in space, for example.

Electric field coupling is always present between two electrodes, provided that at least one of them carries an electrical charge. This electric field coupling, in combination with spacing between the two electrodes, the surface area, and the dielectric, then forms a capacitor, for example. The capacitance of the capacitor can be measured electrically.

The induced charge on an electrode can also be measured by a high-resistance voltmeter, however. The influence or electrostatic induction refers to the spatial displacement of electrical charges through the effect of an electric field.

The coupling of electrodes is the measured variable for the electrostatic sensor system according to the invention. The magnitude of the coupling is generally referred to as the coupling factor.

The coupling factor is expressed either as capacitance or as the ratio between the source voltage on one electrode and the induced voltage on the second electrode.

The electrostatic sensor system according to the invention can easily identify whether a motor-vehicle occupant has properly put on the seat-belt assembly associated with his motor-vehicle seat.

The monitoring of the actuation of the belt lock contact alone does not provide sufficient security in this regard. The corresponding belt lock contact can be simply actuated using a dummy belt lock without the belt strap of the seat-belt assembly even being in place. The monitoring of the rollout length of the belt strap could provide additional security here; however, the belt strap is simply rolled out and locked into the belt lock without having been put on properly. It is then fitted between the body and the backrest of the seat, for example.

With the electrostatic sensor system according to the invention, simple means are used to make it possible to identify such an improper establishment of the belt lock contact.

In the case of the technical solution according to the invention, an essential characteristic of the body of a living thing is advantageously exploited. If a voltage is induced into the body of a living thing, for example through an electrical field, the entire skin surface takes on the same potential due to the low impedance of the body of a living thing. Measurements have shown that it makes absolutely no difference for the skin potential, of for example the right hand, whether the coupling of the voltage occurs on the left foot, on the right foot, or even on the left hand.

According to the invention, at least three electrodes are provided for the evaluation, with one electrode on one object and two electrodes on the other object. The two electrodes provided on the other object are mutually offset, although it is ensured that, if the body of a living thing is present between the two objects, the two electrodes provided on the other object will have body coverage of equal or nearly equal size. The electrode provided on one object is such that, in the event that no body of a living thing is located between the two objects, the spacing to the first of the two electrodes provided on the other object is different from the spacing to the second electrode provided on the other object.

In the controller, the coupling factor between the electrode provided on one object and the first of the two electrodes provided on the other object is determined. Then, the coupling factor between the electrode provided on one object and the second of the two electrodes provided on the other object is determined.

Due to the geometric arrangement of the three electrodes, if no body of a living thing is located between the two objects that have been provided with electrodes, two different coupling factors will be observed.

If a body of a living thing is located between the two objects having electrodes, then the body constitutes a short circuit, so to speak. The different spacing between the one electrode on one object and the first and second electrodes, respectively, on the other object is thus equalized. The two coupling factors are equal or nearly equal.

Advantageously, a threshold is predefined in the controller for the deviation of the two coupling factors from one another, with the two coupling factors being identified as being equal as long as that threshold is not exceeded.

The electrostatic sensor system can be used to special advantage if the two objects on which the electrodes are provided are a seat belt of a seat-belt assembly and a motor-vehicle seat, for example the backrest thereof.

According to an expedient development of the electrostatic sensor system according to the invention, two electrodes are on the seat belt of the seat-belt assembly that extend longitudinally of the seat belt and are offset to each other in the latitudinal direction of the seat belt, and one electrode is on the backrest of the motor-vehicle seat.

An alternating-voltage signal having a frequency of preferably between 40 kHz and 250 kHz can be applied to the two belt electrodes as source electrodes.

The coupling factors can be determined using a time-division multiplexing method, for which purpose an alternating-voltage signal can be applied in a temporally alternating manner to the first and second belt electrodes.

Alternatively, it is possible to apply different alternating-voltage signals to the first and second belt electrodes.

In another embodiment, an alternating-voltage signal having a frequency of preferably between 40 kHz and 250 kHz can be applied to the backrest electrode as the source electrode, in which case the two belt electrodes act as receiving electrodes.

Furthermore, an embodiment can be advantageously realized in which two electrodes are so as to be mutually offset on the backrest of the motor-vehicle seat and one electrode is on the seat belt of the seat-belt assembly.

An alternating-voltage signal having a frequency of preferably between 40 kHz and 250 kHz can be applied to the belt electrode as the source electrode.

Alternatively, an alternating-voltage signal having a frequency of preferably between 40 kHz and 250 kHz can be applied to the two backrest electrodes as source electrodes.

In the advantageous embodiments cited above, the two backrest electrodes and the belt electrode are then receiving electrodes.

In the event that the two backrest electrodes act as source electrodes, it is possible to detect the coupling factors using a time-division multiplexing method if the alternating-voltage signal is applied in a temporally alternating manner to the first and second backrest electrodes.

Alternatively, different alternating-voltage signals can be applied to the first and second backrest electrodes.

For the purpose of substantially eliminating the signals in the far field when using two electrodes as source electrodes, thereby substantially reducing the interference radiation, it is advantageous if an alternating-voltage signal that is phase-shifted by 180° between the two electrodes can be applied to the electrodes that are acting as the transmitting and source electrodes.

In order to also be able to identify using the electrostatic sensor system according to the invention whether the seat belt has been put on properly and then give an indication to that effect, a provision is made according to another advantageous development of the electrostatic sensor system that, in addition to the one electrode that is acting as a receiving electrode, an additional receiving electrode is provided, in which case the two receiving electrodes are at a different spacing from the first and second electrodes that are acting as transmitting and source electrodes, and a respective sum signal can be coupled into the two electrodes that are acting as receiving electrodes, with the phase relationship of the two sum signals being different.

BRIEF DESCRIPTION OF THE DRAWING

The above and other objects, features, and advantages will become more readily apparent from the following description, reference being made to the accompanying drawing in which.

SPECIFIC DESCRIPTION OF THE INVENTION

Figure 1:
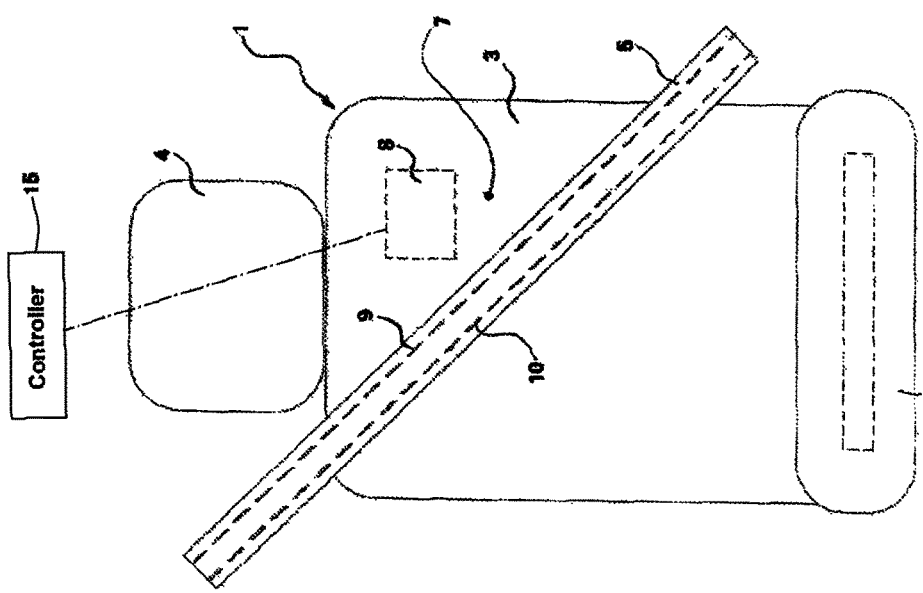
FIG. 1 is a schematic view of a motor-vehicle seat that has been provided with a first embodiment of the electrostatic sensor system according to the invention.

As seen in FIG. 1, a schematically illustrated motor-vehicle seat 1 has a seat part 2, a backrest 3, and a headrest 4 mounted on the upper end of the backrest 3. Moreover, the motor-vehicle seat 1 is equipped with a seat-belt assembly, of which only a seat belt 5 is shown in FIG. 1.

Figure 2:
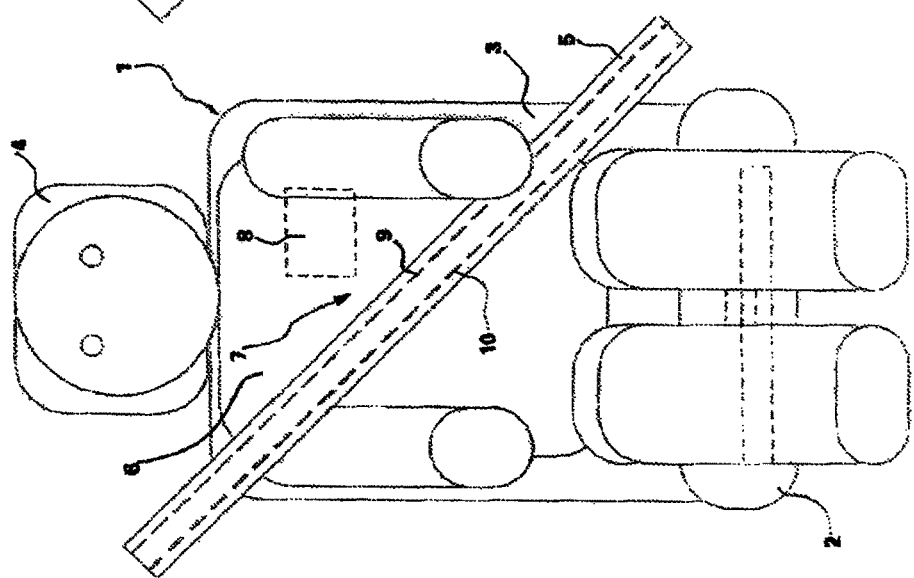
FIG. 2 is a view like FIG. 1, but in which the motor-vehicle seat is occupied by a person.

In FIG. 1, the motor-vehicle seat 1 is unoccupied; in FIG. 2, the same motor-vehicle seat 1 is occupied by a motor-vehicle occupant. As can be seen from FIG. 2, the body 6 of the motor-vehicle occupant is disposed between the seat belt 5 of the seat-belt assembly (otherwise not shown) and the backrest 3 of the motor-vehicle seat 1 when the motor-vehicle seat 1 is properly occupied and the seat-belt assembly is being used correctly.

In order to enable proper operation of the seat-belt assembly of the motor-vehicle seat 1 with a high level of reliability, the motor-vehicle seat 1 is equipped with an electrostatic sensor system 7 described in greater detail below.

As shown in FIGS. 1 and 2, this electrostatic sensor system includes an electrode 8 that, as can be seen from FIG. 1, is in the backrest 3 of the motor-vehicle seat 1.

The electrostatic sensor system 7 further comprises two additional electrodes 9 and 10 that are offset from one another on the seat belt 5 of the seat-belt assembly that is otherwise not shown.

The two belt electrodes 9 and 10 are, as mentioned previously, extend longitudinally of the belt at a transverse spacing so as to be parallel and offset from one another with uniform spacing and, when the motor-vehicle seat 1 is occupied by a person as shown in FIG. 2, cover areas of the same size on the body 6 of this person.

The spacing between the backrest electrode 8 on the one hand and the first belt electrode 9 on the other hand differs from the spacing between the backrest electrode 8 on the one hand and the second backrest electrode 10 on the other hand when the motor-vehicle seat 1 is not occupied by the person as shown in FIG. 2 and, accordingly, the body 6 of this person is not between the seat belt 5 and the backrest 3 of the motor-vehicle seat.

In the embodiment of the electrostatic sensor system 7 shown in FIGS. 1 and 2, an alternating-voltage signal is applied to the two electrodes 9 and 10 the seat belt 5 as source electrodes. In this embodiment, the frequency of this alternating-voltage signal is generally in the range between 40 kHz and 250 kHz. These relatively low frequencies are usually used because the components such frequencies require are relatively inexpensive. Moreover, few or no electrical systems exist in a motor-vehicle with a conventional construction that could be disrupted by this frequency range. Due to the selected wavelength, all of the physical processes that are associated with the operation of the electrostatic sensor system 7 described above take place in the near field.

A controller 15 of the electrostatic sensor system determines coupling factors between the backrest electrode 8 on the one hand and the first belt electrode 9 and the second belt electrode 10 on the other hand. Moreover, the controller 15 can compare these two coupling factors with one another.

As mentioned previously, in the embodiment of the electrostatic sensor system 7 shown in FIGS. 1 and 2, the backrest electrode 8 is a receiving electrode and the two belt electrodes 9 and 10 are source or transmitting electrodes. The two coupling factors, namely the coupling factor between the first belt electrode 9 and the backrest electrode 8 as well as between the second belt electrode 10 and the backrest electrode 3, can be determined by a time-division multiplexing method. In this case, the previously mentioned alternating-voltage signal is fed alternately to the first belt electrode 9 and the second belt electrode 10 from the controller 15.

During each of the resulting time intervals, the voltage induced in the one backrest electrode 8 is measured or detected. The two measured voltages, more particularly the coupling factors determined in this way are compared.

If the voltages or coupling factors that are compared with one another are equal or nearly equal within the measurement accuracy of the controller 15 of the electrostatic sensor system 7, then the body 6 of the person shown in FIG. 2 is located between the seat belt 5 of the seat-belt assembly and the backrest 3 of the motor-vehicle seat 1.

If the two voltages or coupling factors differ substantially from one another, then it can be assumed that no body of a living thing is located between the seat belt 5 of the seat-belt assembly on the one hand and the backrest 3 of the motor-vehicle seat 1 on the other hand. Accordingly, the seat belt 5 is not properly in place.

As an alternative to the time-division multiplexing method described above, in which the alternating-voltage signal is fed alternately to the first belt electrode 9 and to the second belt electrode 10, it is possible to apply different alternating-voltage signals to the first belt electrode 9 and the second belt electrode 10. However, this requires that the portions of the two alternating-voltage signals be extracted from the voltage signal or the coupling factor based thereon induced in the backrest electrode 8 that acts as a receiving electrode. The advantage of simultaneous detection is then juxtaposed with the disadvantage of greater technical complexity.

The voltage or coupling factor ratio at which the alternating-voltage signals are assessed as being different or equal is compared with a threshold value that is established beforehand. The threshold is dependent on interpretation and is usually determined experimentally according to the profile of requirements placed on the electrostatic sensor system 7.

In an alternative embodiment of the embodiments illustrated in FIGS. 1 and 2, the alternating-voltage signal is applied to the backrest electrode 8 as a source electrode. The two belt electrodes 9 and 10 at which the respectively induced voltage and thus the two coupling factors are measured or detected, then act as receiving electrodes.

With regard to the evaluation of the coupling factors in the controller 15, the procedure followed is analogous to that employed in the case of the first-described embodiment.

Figure 3:
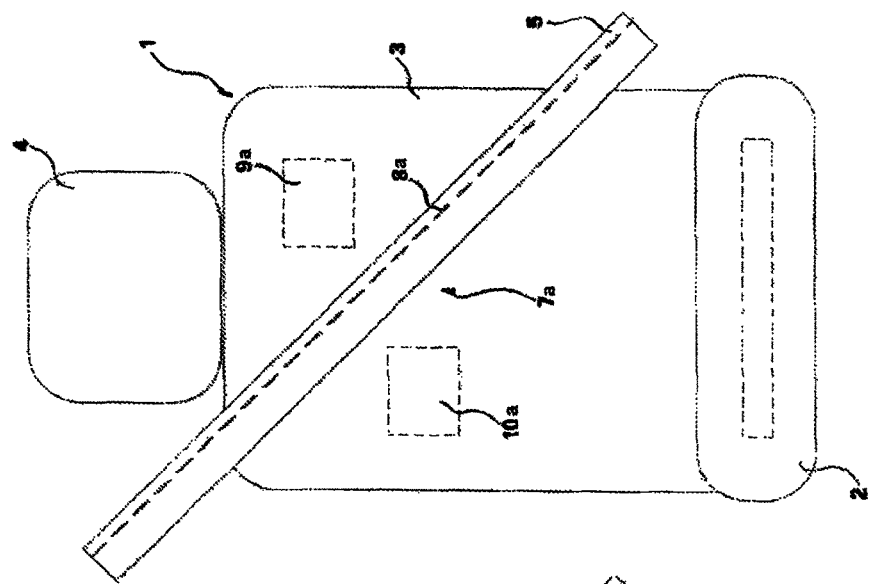
FIG. 3 is a schematic view of a motor-vehicle seat with a second embodiment of the electrostatic sensor system according to the invention.
Figure 4:
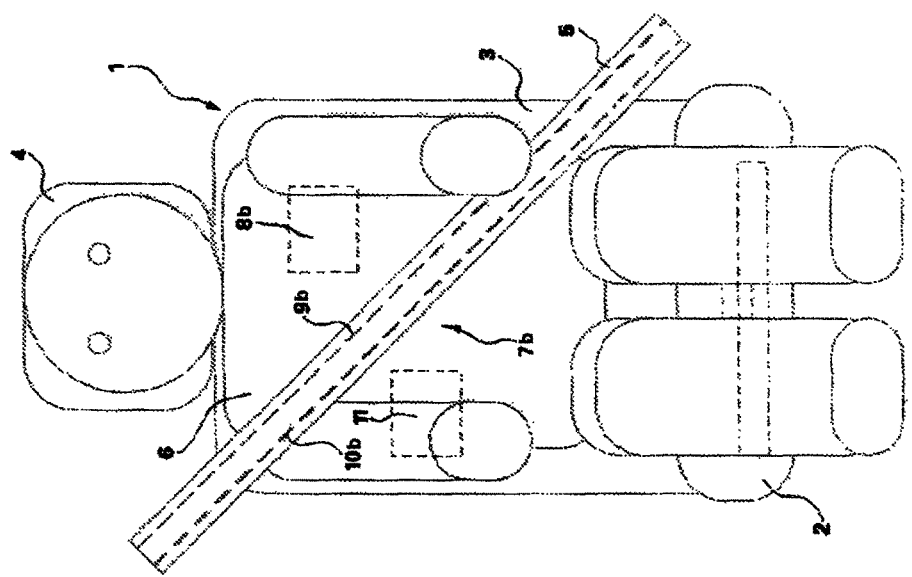
FIG. 4 is a view like FIG. 3, but in which the motor-vehicle seat is occupied by a person.

Another advantageous embodiment of the electrostatic sensor system 7 according to the invention is shown in FIGS. 3 and 4, with FIG. 4 showing the motor-vehicle seat 1 with the person having the body 6 as the motor-vehicle occupant.

In the embodiment shown in FIGS. 3 and 4, two electrodes 9a and 10a of a sensor system 7a are mounted on the backrest 3 of the motor-vehicle seat 1 so as to be mutually offset, as can be seen from FIGS. 3 and 4. In addition an electrode 8a that extends longitudinally of the seat belt 5 is provided on the seat belt 5 of the seat-belt assembly (otherwise not shown) associated with the motor-vehicle seat 1.

In a first embodiment, the belt electrode 8a acts as a source electrode to which the alternating-voltage signal is applied. Accordingly, the two backrest electrodes 9a and 10a act as receiving electrodes where the respectively induced voltage is measured, and the resulting coupling factor is determined. The evaluation is performed in the controller 15 in a manner analogous to the embodiment described above.

According to an alternative embodiment to the embodiment of the electrostatic sensor system 7a shown in FIGS. 3 and 4, the two backrest electrodes 9a and 10a are source electrodes, and the alternating-voltage signal is applied alternately by the time-division multiplexing method. Alternatively, two different alternating-voltage signals can be applied to the two backrest electrodes 9a and 10a that are acting as source electrodes. The induced voltage is measured at the belt electrode 8a.

As in the method with two different alternating-voltage signals described above, the signal components in the induced voltage must be separated in the controller 15 (FIG. 1) by filtering, that results in increased technical effort.

Otherwise, the evaluation of the coupling factors determined by the controller 15 is performed according to the embodiments described above.

Another, especially preferred embodiment of the electrostatic sensor system according to the invention shown in FIGS. 1 and 2 with the one backrest electrode 8 and the two belt electrodes 9 and 10 is characterized in that an alternating-voltage signal is applied to the two belt electrodes 9 and 10 that is phase-shifted by 180° between the two belt electrodes 9 and 10. This ensures, among other things, that the two alternating-voltage signals substantially cancel each other out in the far field. Interference radiation is substantially reduced.

Electrically, a 180° phase-shifted alternating-voltage signal is very easy to achieve by signal inversion (multiplication by −1).

Then only the induced voltage need be measured at the one backrest electrode 8 that is acting as a receiving electrode. In the event that the body 6 of a living thing is located between the two belt electrodes 9 and 10 that are acting as source electrodes on the one hand and the one backrest electrode 8 that is acting as a receiving electrode, the signal disappears nearly completely due to obliteration through superposition.

For the signal range in which an equality of the signal is observed, a threshold value should again be determined experimentally.

If the voltage induced in the one backrest electrode that is acting as a receiving electrode lies above the abovementioned threshold, then it can be concluded from this that either the original alternating voltage or the 180° phase-shifted alternating voltage is predominant due to different spacings between the two belt electrodes acting as source electrodes on the one hand and the one backrest electrode that is acting as a receiving electrode on the other hand. No obliteration takes place.

In this embodiment, mutually phase-shifted harmonic signals are applied to the two belt electrodes. The phase-shift angle is phi.

The signal x1(t) is applied to the first belt electrode 9.

$$x1(t) = \hat{x} \cos(\omega t)$$

The signal x2(t) is applied to the second belt electrode 10.

$$x2(t) = \hat{x} \cos(\omega t + \varphi)$$

A phase shift of 180° is also referred to as a phase reversal. In circuit engineering, this is especially simple to produce through the inversion of the reference signal, as already noted previously.

Since the two signals x1(t) and x2(t) are emitted by electrodes 9 and 10 that act as antennas and are in different spatial locations, there are location-independent superposition.

Insofar as the two electrodes 9 and 10 are equidistant from the backrest electrode 8 that is acting as an antenna, a signal in which $$x(t) = x1(t) + x2(t) = \hat{x} \cos(\omega t) + \hat{x} \cos(\omega t + \varphi)$$

is received there.

If the spacings between the two belt electrodes 9 and 10 on the one hand and the one backrest electrode 8 on the other hand are different, the coupling factors detected in the latter will vary. All that need then be determined by the controller 15 is which of the two signals x1(t) and x2(t) is predominant in the sum signal.

To do this, the phase shift of the signal coupled into the backrest electrode 8 relative to a phase-angle body of a living thing of phi/2. If the received sum signal has a phase shift of <phi/2, then the first belt electrode 9 with the signal x1(t) that is acting as a source electrode is closer to the backrest electrode 8 that is acting as a receiving electrode than the other, second belt electrode 10 with the signal x2(t) that is acting as a source electrode.

If the phase shift of the sum signal is >phi/2, then the spacing between the backrest electrode 8 that is acting as a receiving electrode on the one hand and the electrode 10 with the signal x2(t) that is acting as a source electrode on the other hand is less than the spacing between the backrest electrode 8 on the one hand and the first belt electrode 9 on the other hand.

If the phase shift of the sum signal=phi/2, then the two belt electrodes 9 and 10 that are acting as source electrodes are equidistant to the backrest electrode 8 that is acting as a receiving electrode.

This embodiment has the distinctive feature that, given the equal spacing, the sum signal becomes zero, since:

$$0 = \hat{x}\cos(\omega t) + (-\hat{x}\cos(\omega t + 180°))$$

Figure 5:
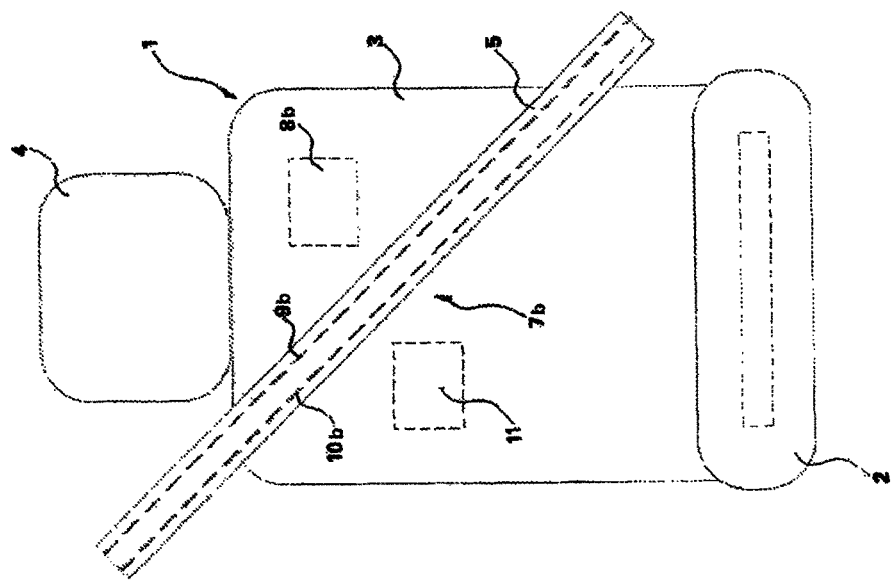
FIG. 5 is a schematic view of a motor-vehicle seat with a third embodiment of the electrostatic sensor system according to the invention.
Figure 6:
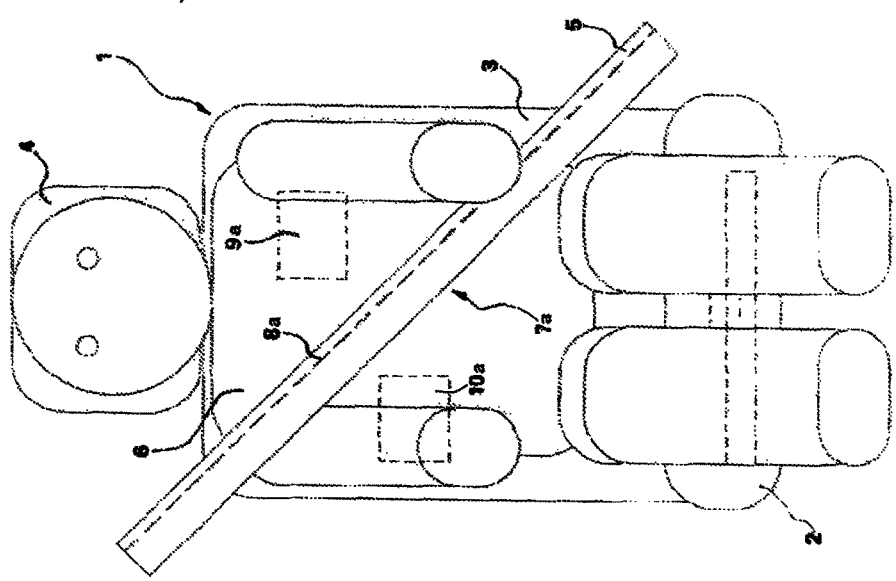
FIG. 6 is a view like FIG. 5, but in which the motor-vehicle seat is occupied by a person.

In an embodiment of the electrostatic sensor system 7b according to the invention that will be described in the following with reference to FIGS. 5 and 6, besides the two belt electrodes 9b and 10b that act as source electrodes and the one backrest electrode 8b that acts as a receiving electrode, an additional backrest electrode 11 is provided that acts as a receiving electrode. As can be seen from FIGS. 5 and 6, the second backrest electrode 11 is on the backrest 3 of the motor-vehicle seat 1 so as to be offset relative to the first backrest electrode 8b. The first backrest electrode 8b that is acting as a receiving electrode is such that the seat belt 5 passing in front of the backrest 3 of the motor-vehicle seat 1 feeds a sum signal with a phase relationship of <phi/2 into the above-mentioned first backrest electrode 8 by the two electrodes 9b and 10b provided therein or thereon and acting as source electrodes.

The above-mentioned second backrest electrode 11 that is being used as a receiving electrode is such that the seat belt 5 running in front of the backrest 3 of the motor-vehicle seat 1 and having the two electrodes 9b and 10b with the abovementioned signals x1(t) and x2(t) that are acting as source electrodes couples a sum signal with a phase relationship of >phi/2 into this second backrest electrode 11 that is acting as a receiving electrode.

If phi=180°, the distinctive technical feature arises that, independently of the coupling factors, only sum signals with a 0° phase angle or 180° phase angle can occur.

If, as described above, two backrest electrodes 8b and 11 that are acting as receiving electrodes are used, this results in the following schema:

The controller 15 (FIG. 1) evaluates the phase relationship of the two received signals. If these two signals are offset by 180° relative to one another, then no body 6 of a living thing is located between the belt electrodes 9 and 10 that are acting as source electrodes and the two backrest electrodes 8, 11 that are acting as receiving electrodes.

If a body 6 is located between the two backrest electrodes 8b and 11 that are acting as receiving electrodes and the two belt electrodes 9b and 10b that are acting as source electrodes, then the two signals are coupled nearly identically into this body 6. Since the two signals are phase-shifted by 180°, they cancel each other out in the body 6 under the same coupling conditions. The body 6 then has a surface potential that tends toward 0 V.

It is possible that the reception amplitudes in the two receiving electrodes 8b and 11 may vary due to different coupling conditions between the body 6 and the two receiving backrest electrodes 8b and 11, but the two received signals will always have the same phase relationship.

It can also be identified by this embodiment on the basis of the phase relationship in the receiving backrest electrodes 8b and 11 whether the seat belt has been put on in a twisted state, in which case an indication to that effect can be outputted.

In principle, it is possible to develop the electrostatic sensor system described above on the basis of various embodiments and designs for additional applications. For instance, by using additional electrodes that are installed on the rear or back wall of the backrest 3, for example, it is easily possible to identify when the seat belt 5 is behind the backrest 3 of the motor-vehicle seat 1. In this case as well, the seat-belt assembly of the motor-vehicle seat 1 is not being used properly.

I claim:

1. An electrostatic sensor system carried on two relatively movable objects that can assume different spatial configurations relative to one another and between which a body of a living thing can be disposed between for determining whether the body is disposed between the two objects, the system comprising:
   one electrode on one of the two objects, the two objects being a seat belt of a seat-belt assembly and a motor-vehicle seat;
   first and second electrodes on the other of the two objects offset relative to one another such that when a body is present between the two objects the first and second electrodes have equal- or nearly equal-area body coverage whereas, if no body is between the two objects, the one electrode on the one object is at a different spacing from the first electrode on the other object than from the second electrode on the other object; and
   control means for
   applying an electrical charge to the one electrode on the one object or the first and second electrodes on the other object,
   determining and detecting a coupling factor between the one electrode on the one object and the first electrode on the other object and a coupling factor between the one electrode on the one object and the second electrode on the other object, and
   comparing the two coupling factors with one another.

2. The electrostatic sensor system defined in claim 1, wherein the control means further predefines a threshold for the deviation of the two coupling factors from one another and identifies the two coupling factors as equal as long as that threshold is not exceeded.

3. The electrostatic sensor system defined in claim 1, wherein the seat belt is elongated and the first and second electrodes extend longitudinally and transversely spaced on the seat belt as belt electrodes and the one electrode is mounted on a backrest of the motor-vehicle seat.

4. The electrostatic sensor system defined in claim 3, wherein the control means applies an alternating-voltage signal having a frequency between 40 kHz and 250 kHz to the first and second electrodes as source electrodes as the electrical charge.

5. The electrostatic sensor system defined in claim 4, wherein the control means applies the alternating-voltage signal in a temporally alternating manner to the first and second belt electrodes.

6. The electrostatic sensor system defined in claim 4, wherein the control means applies different alternating-voltage signals to the first and second belt electrodes.

7. The electrostatic sensor system defined in claim 4, wherein the control means applies an alternating-voltage signal that is phase-shifted by 180° between the first and second electrodes to the first and second electrodes as the electrical charge.

8. The electrostatic sensor system defined in claim 3, wherein the control means applies an alternating-voltage signal having a frequency between 40 kHz and 250 kHz to the one electrode as a source electrode as the electrical charge.

9. The electrostatic sensor system defined in claim 1, wherein the first and second electrodes are mounted mutually offset on a backrest of the motor-vehicle seat and the one electrode is on the seat belt of the seat-belt assembly.

10. The electrostatic sensor system defined in claim 9, wherein the control means applies an alternating-voltage signal having a frequency of between 40 kHz and 250 kHz to the one electrode as a source electrode as the electrical charge.

11. The electrostatic sensor system defined in claim 9, wherein the control means applies an alternating-voltage signal having a frequency of between 40 kHz and 250 kHz to the first and second electrodes as source electrodes.

12. The electrostatic sensor system defined in claim 11, wherein the control means applies the alternating-voltage signal in a temporally alternating manner to the first and second belt electrodes.

13. The electrostatic sensor system defined in claim 11, wherein the control means applies different alternating-voltage signals to the first and second electrodes on the backrest.

14. The electrostatic sensor system defined in claim 11, wherein the control means applies an alternating-voltage signal that is phase-shifted by 180° between the first and second electrodes to the first and second electrodes.

15. The electrostatic sensor system defined in claim 14, further comprising in addition to the one electrode acting as a receiving electrode:
   an additional receiving electrode, the receiving electrodes being at a different spacing from the first and second electrodes acting as transmitting and source electrodes, the control means feeding a respective sum signal into the first and second electrodes that are acting as receiving electrodes with the phase relationship of the two sum signals being different.

* * * * *